United States Patent [19]
Khan et al.

[11] Patent Number: 6,038,174
[45] Date of Patent: Mar. 14, 2000

[54] PRECISION PROGRAMMING OF NONVOLATILE MEMORY CELLS

[75] Inventors: Sakhawat M. Khan, Sunnyvale; George J. Korsh, Redwood City, both of Calif.

[73] Assignee: Agate Semiconductor, Inc., Santa Clara, Calif.

[21] Appl. No.: 09/197,479

[22] Filed: Nov. 20, 1998

Related U.S. Application Data

[63] Continuation of application No. 08/812,868, Mar. 6, 1997, Pat. No. 5,870,335.

[51] Int. Cl.$^7$ .................................................. G11C 16/06
[52] U.S. Cl. ............................... 365/185.28; 365/185.03; 365/185.18
[58] Field of Search .................. 365/185.28, 185.18, 365/185.03, 185.22, 185.29

[56] References Cited

U.S. PATENT DOCUMENTS

| | | | |
|---|---|---|---|
| 4,622,656 | 11/1986 | Kamiya et al. | 365/185 |
| 4,794,565 | 12/1988 | Wu et al. | 365/185 |
| 5,029,130 | 7/1991 | Yeh | 365/185 |
| 5,042,009 | 8/1991 | Kazerounian et al. | 365/185 |
| 5,043,940 | 8/1991 | Harari | 365/168 |
| 5,119,330 | 6/1992 | Tanagawa | 365/168 |
| 5,198,380 | 3/1993 | Harari | 437/43 |
| 5,218,571 | 6/1993 | Norris | 365/189.09 |
| 5,220,531 | 6/1993 | Blyth et al. | 365/189.09 |
| 5,258,949 | 11/1993 | Chang et al. | 365/185 |
| 5,293,560 | 3/1994 | Harari | 365/185 |
| 5,297,096 | 3/1994 | Terada et al. | 365/185.11 |
| 5,313,421 | 5/1994 | Gateman et al. | 365/185.11 |
| 5,357,476 | 10/1994 | Kuo et al. | 365/185.12 |
| 5,371,031 | 12/1994 | Gill et al. | 438/264 |
| 5,422,842 | 6/1995 | Cernea et al. | 365/185 |
| 5,440,505 | 8/1995 | Fazio et al. | 365/45 |
| 5,475,634 | 12/1995 | Wang et al. | 365/185.17 |
| 5,477,499 | 12/1995 | Van Buskirk et al. | 365/218 |
| 5,487,033 | 1/1996 | Keeney et al. | 365/185.19 |
| 5,539,690 | 7/1996 | Talreja et al. | 365/185.22 |
| 5,566,111 | 10/1996 | Choi | 365/185.22 |
| 5,566,125 | 10/1996 | Fazio et al. | 365/45 |
| 5,590,076 | 12/1996 | Haddad et al. | 365/185.25 |
| 5,592,415 | 1/1997 | Kato et al. | 365/185.01 |
| 5,629,890 | 5/1997 | Engh | 365/185.03 |
| 5,633,822 | 5/1997 | Campardo et al. | 365/185.03 |
| 5,687,114 | 11/1997 | Lhan | 365/185.03 |
| 5,694,356 | 12/1997 | Wong et al. | 365/185.03 |
| 5,712,815 | 1/1998 | Bill et al. | 365/185.03 |

OTHER PUBLICATIONS

Eitan et al., "Hot–Electron Injection into the Oxide in n–Channel MOS Devices," *IEEE Transactions on Electron Devices*(1981) *E–28*:328–340.

Kamiya et al., "EPROM Cell with High Gate Injection Efficiency," *IEDM 82*(1982) pp. 741–744.

Tam et al., "Lucky–Electron Model of Channel Hot–Electron Injection in MOSFET's," *IEEE Transactions on Electron Devices*(1984) *ED–31*:1116–1125.

Van Houdt et al., "An Analytical Model for the Optimization of Source–Side Injection Flash EEPROM Devices," *IEEE Transactions on Electron Devices*(199) 42: 1314–1320.

*Primary Examiner*—David Nelms
*Assistant Examiner*—Hoai V. Ho
*Attorney, Agent, or Firm*—Townsend and Townsend and Crew LLP

[57] ABSTRACT

An integrated circuit memory system and method for precision hot carrier injection programming of single or plurality of nonvolatile memory cells is described. Each program cycle is followed by a verify cycle. Precision programming is achieved by incrementally changing a programming current pulse flowing between the source and drain in the memory cell during successive program cycles and a constant current during successive verify cycles. Current control and voltage mode sensing circuitry reduces circuit complexity, reduces programming cell current, lowers power dissipation, and enables page mode operation. Precision programming is useful for multilevel digital and analog information storage.

70 Claims, 7 Drawing Sheets

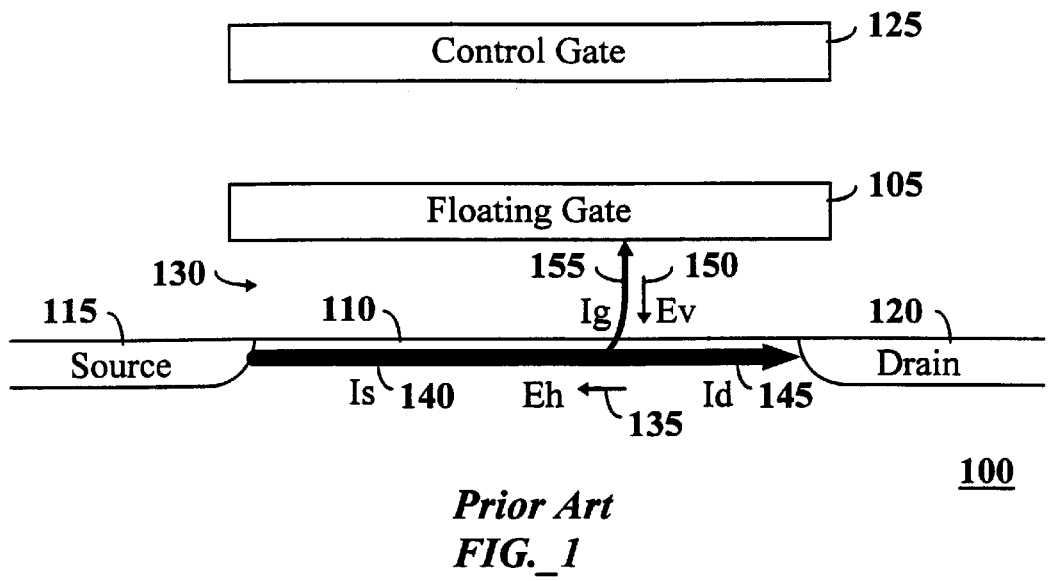
*Prior Art*
*FIG._1*
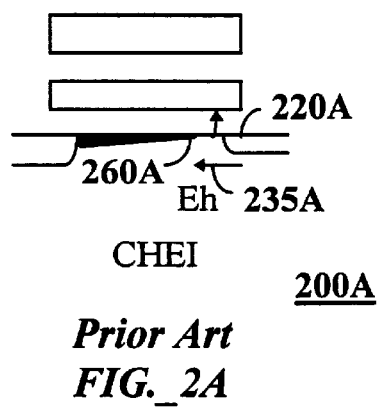
CHEI
*Prior Art*
*FIG._2A*
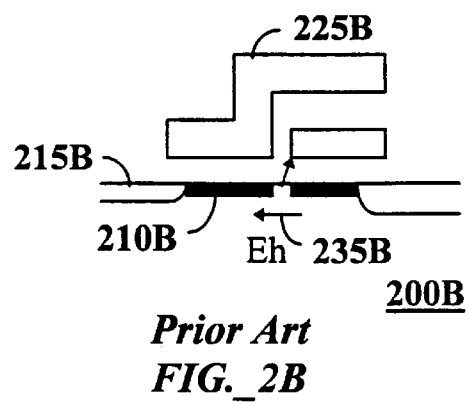
*Prior Art*
*FIG._2B*

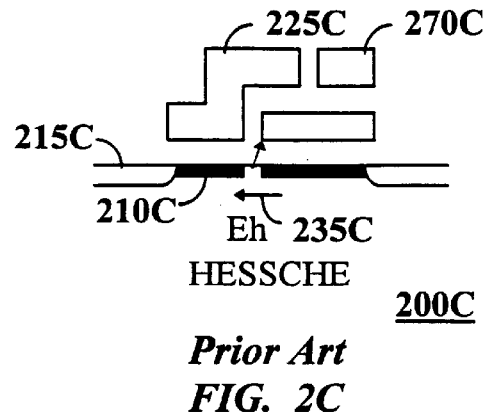
HESSCHE
*Prior Art*
*FIG._2C*
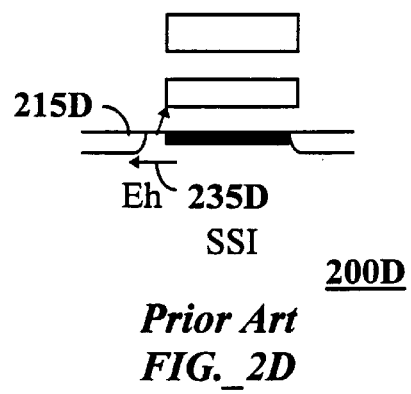
SSI
*Prior Art*
*FIG._2D*
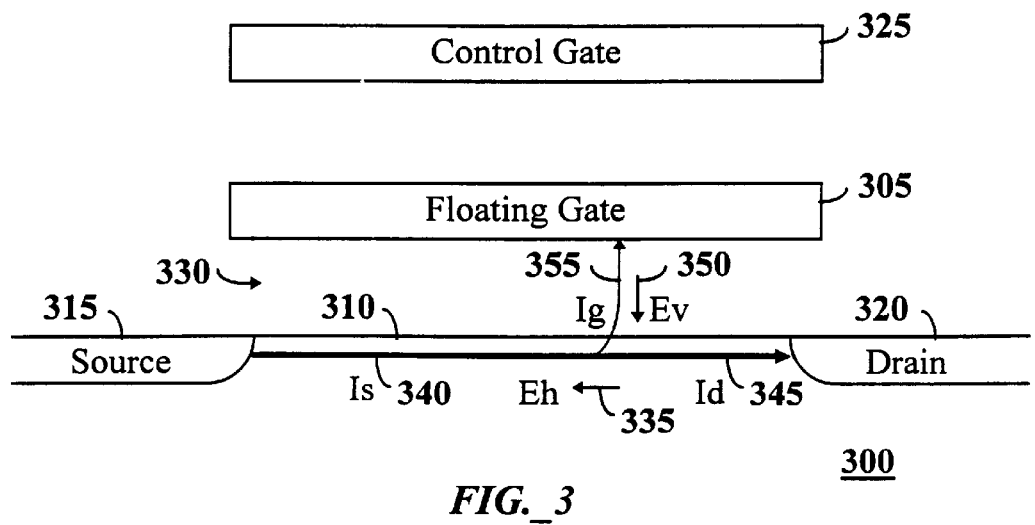
*FIG._3*

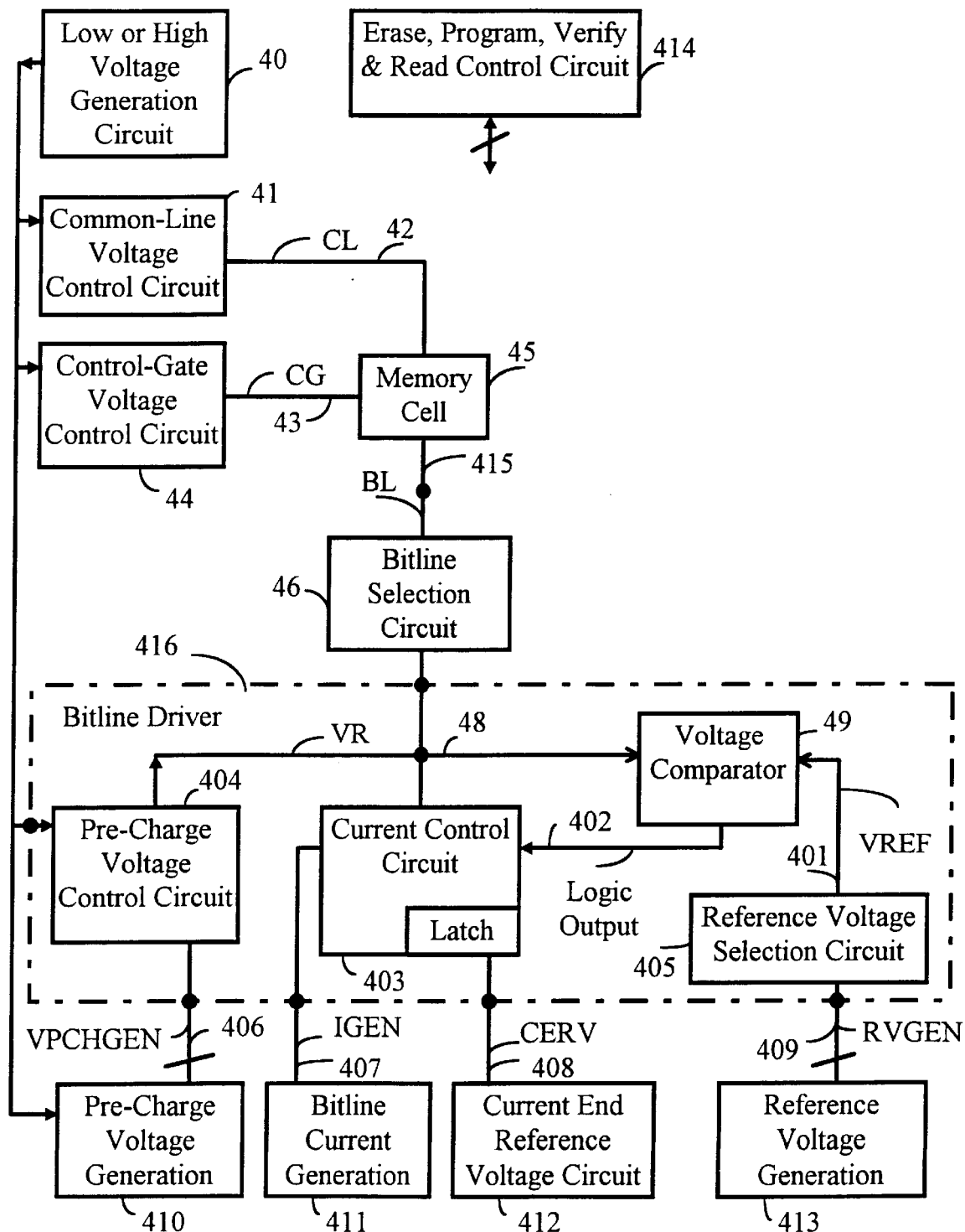
Fig._4

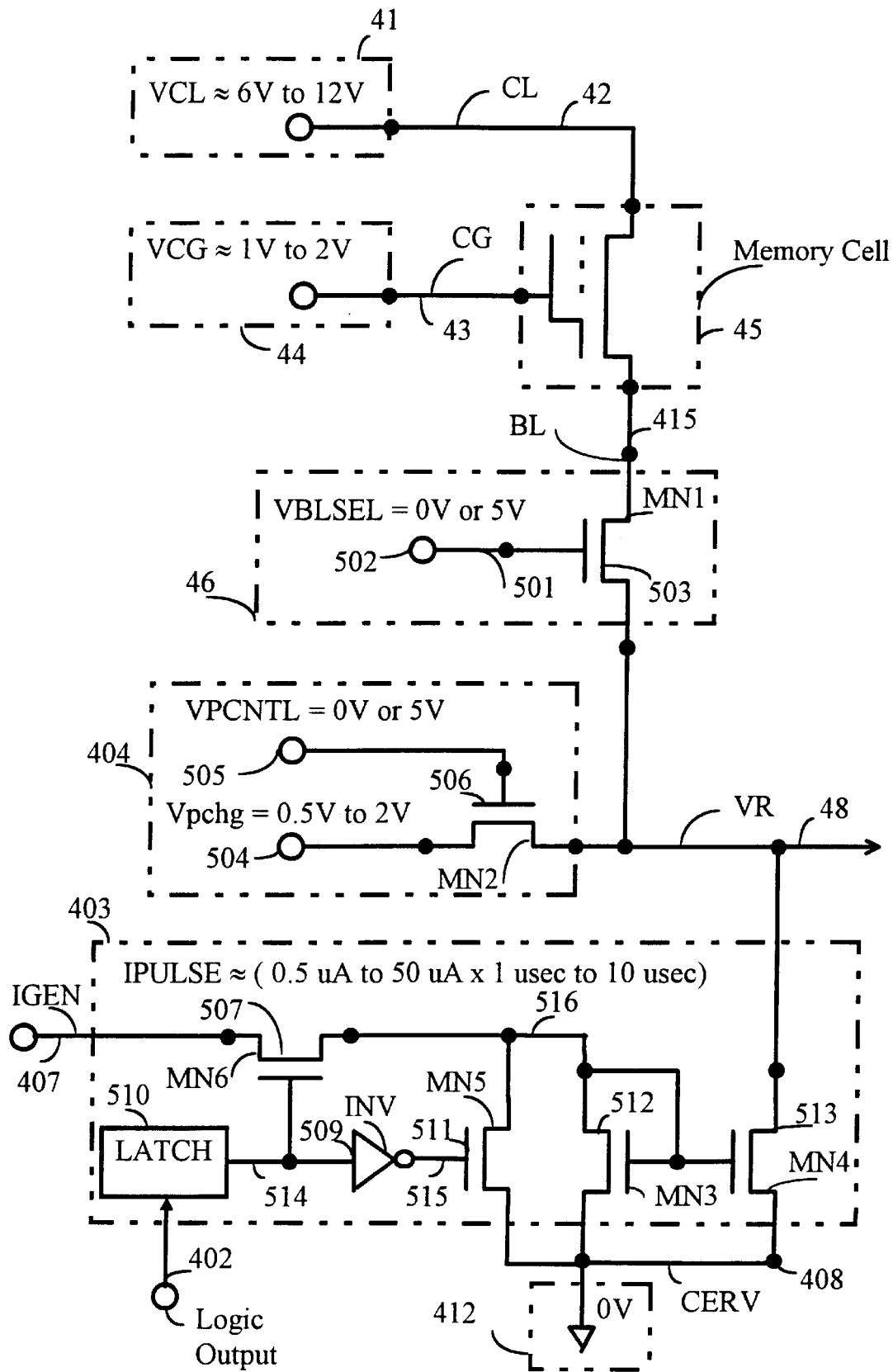
Fig._5A

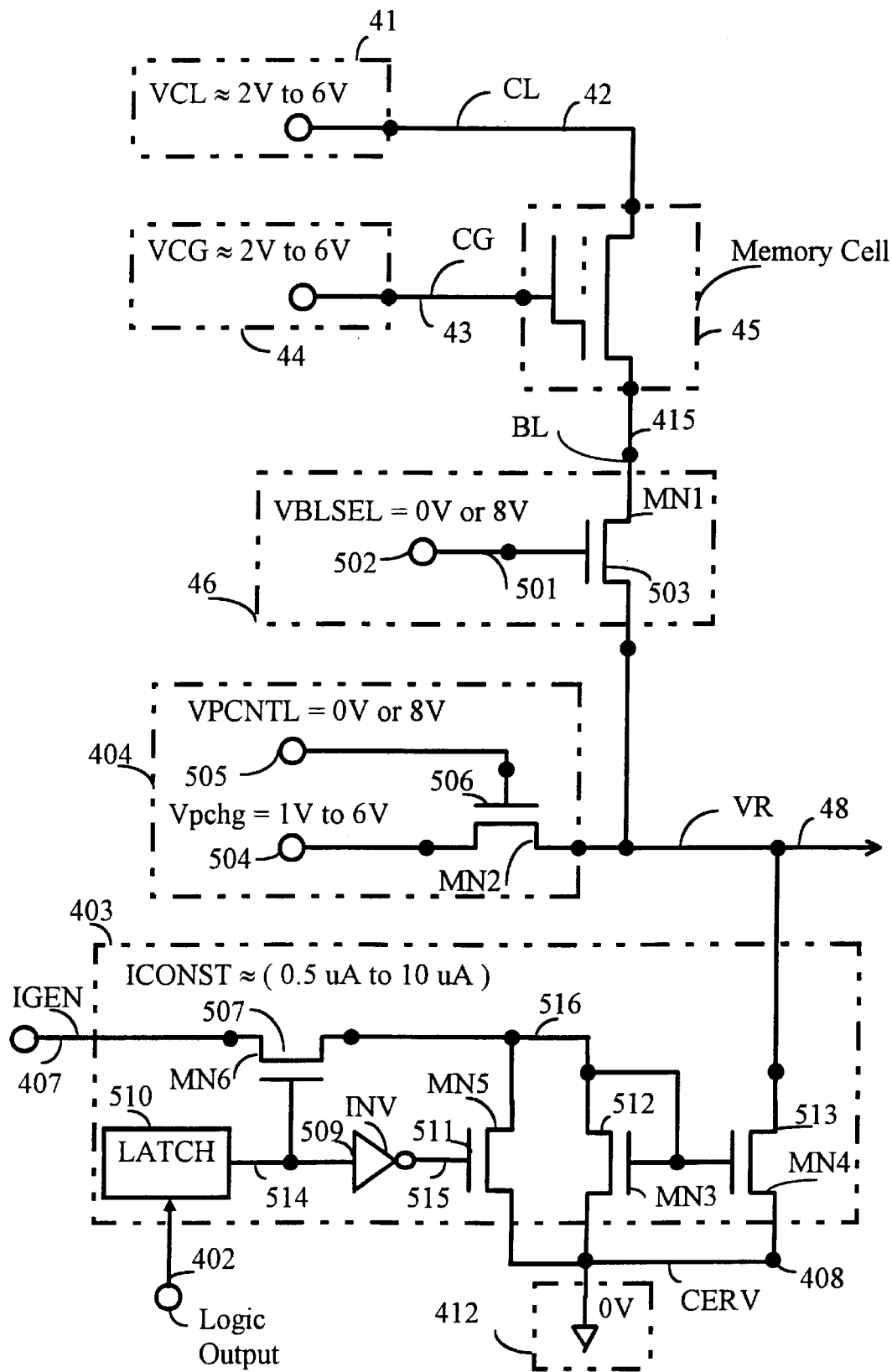
Fig._5B

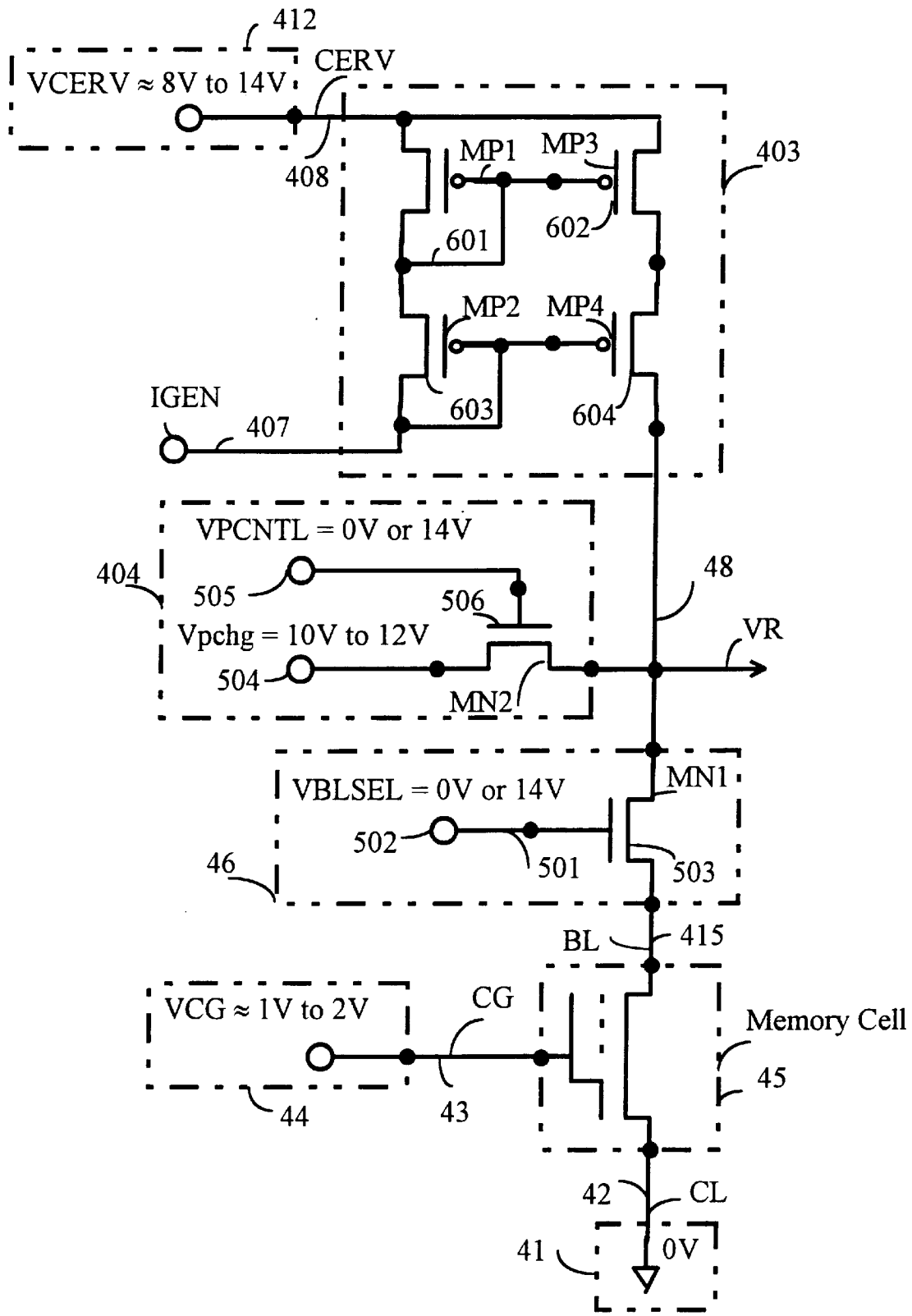
Fig._6

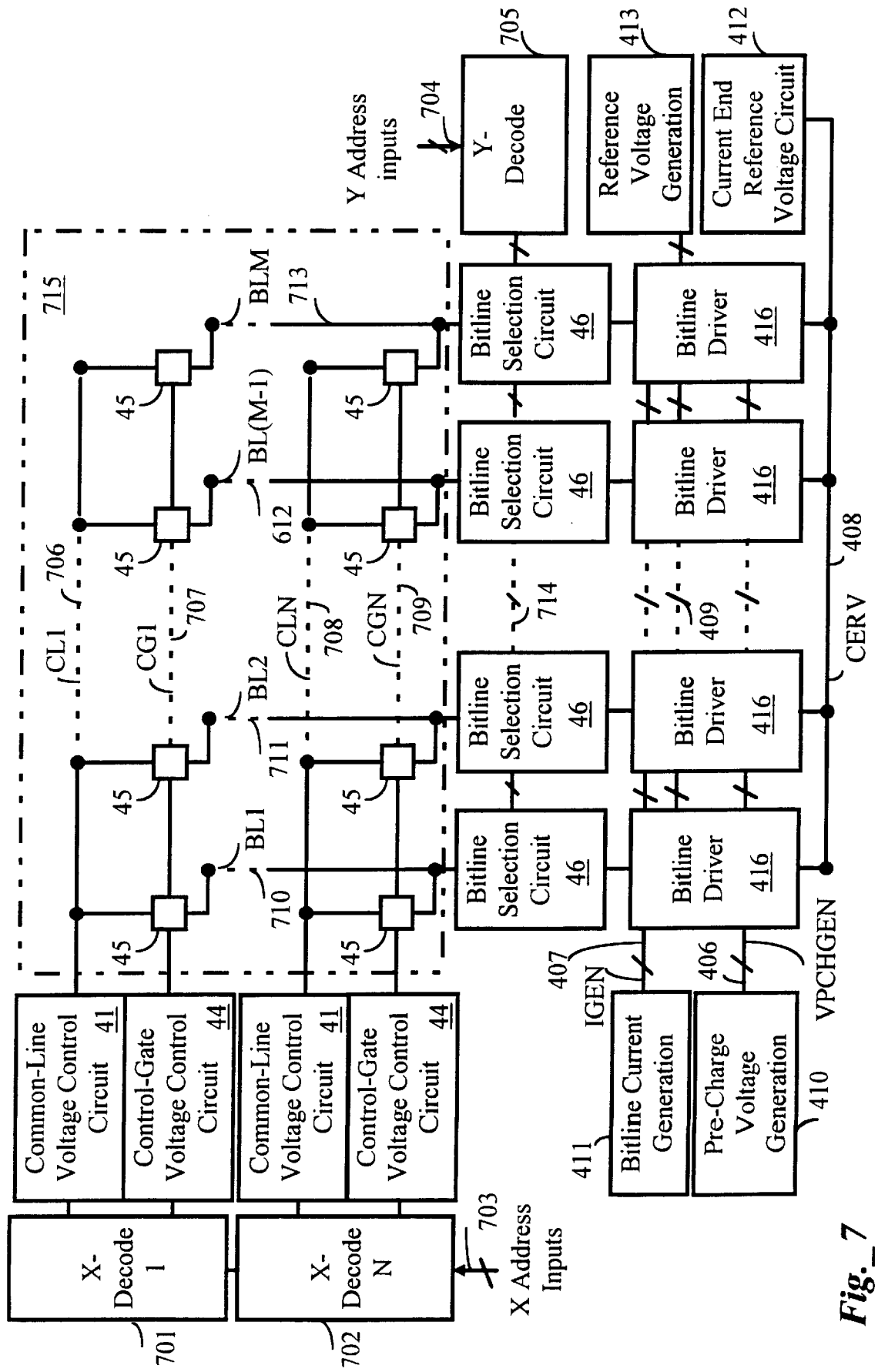
Fig._7

PRECISION PROGRAMMING OF NONVOLATILE MEMORY CELLS

Continuation of prior application Ser. No. 08/812,868, filed Mar. 6, 1997, now U.S. Pat. No. 5,870,335.

FIELD OF THE INVENTION

This invention relates in general to semiconductor memories and, in particular, to the programming of nonvolatile semiconductor memories.

BACKGROUND OF THE INVENTION

Nonvolatile semiconductor memory integrated circuits, such as EEPROM, EPROM, and FLASH, have traditionally been used to store a single digital bit per memory cell, which is termed hereafter as single bit storage. Memories capable of storing more than one bit of digital data per memory cell and their benefits have been described previously and are called multilevel memories. A level represents a specific range of electrical charge stored in each memory cell. To store N bits per memory cell requires $2^N$ discrete levels. Each discrete level corresponds to a unique binary data pattern for all N bits. The cell is erased or programmed to store charge within one of these $2^N$ discrete levels. Sensing circuits determine which level of charge is stored in the cell and read out the corresponding binary data pattern stored for the N bits. Digital information can thus be stored at a significantly lower cost per bit since N times the number of bits can be stored in the same memory cell array area previously storing just a single bit per cell.

Nonvolatile semiconductor memory integrated circuits using EEPROM and FLASH memory cells have also been used to store analog information. In this case, the amount of electrical charge stored in each memory cell is part of a continuum instead of discrete multiple levels. The precision of the stored charge determines the signal to noise ratio of the analog information.

EEPROM, EPROM, and FLASH memory cells are typically based on silicon gate MOS transistor technology. Such a nonvolatile memory cell 100 is shown in FIG. 1. Charge is stored on a piece of silicon which is called a floating gate 105. This gate is completely surrounded by silicon dioxide which, ideally, can only pass charge during program or erase operations and so is called "floating". The floating gate 105 is formed near a silicon channel 110 between a source 115 and a drain 120 diffusion regions. The floating gate 105 voltage is determined by the amount of charge stored and by the adjacent capacitive coupling to a control gate 125, source 115, drain 120, and channel 110. The conductivity of the silicon channel 110 is controlled by the floating gate 105 voltage in an similar manner as in a classic MOS transistor.

Nonvolatile memory cell programming requires charge passage through an oxide 130 to the floating gate 105 and is accomplished via two mechanisms; tunneling and hot carrier injection. Hot carriers, in the case of an n-channel device, are electrons with sufficient energy to conduct through silicon dioxide. Hot electron programming requires two basic conditions to be met. First, a source of hot electrons must be generated in the channel 110. This is accomplished by creating a high electric field region, Eh 135, in the channel 110 to accelerate the electrons to an energy sufficient to make them "hot". In FIG. 1 the flow of electrons in the channel 110 is represented by a source current, Is 140, and a drain current, Id 145. Second, a vertical electric field, Ev 150, between the floating gate 105 and channel 110 must attract the hot electrons toward the floating gate 105. The hot electrons which flow to the floating gate 105 create a floating gate charging current, Ig 155.

Many different cell structures exist utilizing the hot carrier injection mechanism; all require the two basic conditions described above. FIG. 2 shows some examples of such cells. In a Channel Hot Electron Injection (CHEI) cell design 200A, the cell is biased in a saturated mode of transistor operation. A high electric field region, Eh 235A, is generated between a drain 220A and a point of channel saturation 260A. More recently, cells have been designed which generate a high Eh 235B and 235C midway in the channel by extending a control gate 225B and 225C over a channel 210B and 210C on a source end 215B and 215C of a cell 200B or with an additional gate 270C as shown in a High Efficiency Source Side Channel Hot Electron Injection (HESSCHEI) cell 200C. A high Eh 235D can also be generated near a source 215D by a Source Side Injection (SSI) cell 200D.

There are many technical challenges associated with multilevel and analog nonvolatile memories. Since the total charge storage range for a cell is constrained, the amount of charge stored in the memory cell must be controlled within a very narrow range for each level in a multilevel memory. The severity of this problem increases geometrically as the number of bits stored per multilevel memory cell increases since $2^N$ discrete levels per cell are required to store N bits per cell. In analog memory the total charge storage range must cover the dynamic range of the analog signal. The precision of the stored charge determines the signal to noise ratio of the analog information. For analog signals the challenge is dealing with signals with wide dynamic range and/or high signal to noise ratio. In both applications the charge must be initially stored during programming with a high degree of precision.

To obtain the programming precision required for multilevel cells, iterative programming algorithms have been used. These algorithms provide a programming voltage pulse followed by a read or verify step. The program/verify sequence is repeated until the desired charge storage level in the cell is reached with the desired precision. As more charge is stored on the floating gate 105, the Ev 150 reduces, thereby slowing the programming. To continue programming at a sustained rate, the biasing voltages applied to the control gate 125 or drain 120 are increased with subsequent programming pulses. Hot carrier injection programming methods require high voltages, beyond the power supply voltages, to be applied to the control gate 125 and drain 120 of the cell to generate sufficiently high Eh 135 and Ev 150. Controlling such high voltages in a complex algorithm increases circuit complexity.

The read or verify sensing steps must be accomplished with adequate precision to halt the programming algorithm at the desired level in the case of multilevel and at the correct charge state for analog storage. Various sensing approaches have been described and can be generally divided into two modes of operation. During current-mode sensing, the current flowing in the cell is dependent on the charge stored in the cell. The cell is biased by applying voltages and a current flowing in the cell is sensed. During voltage-mode sensing the current flowing in the cell is not dependent on the charge stored in the cell. In voltage-mode, the cell is biased by applying a fixed current and a voltage is sensed which corresponds uniquely to the amount of charge stored on the floating gate of the cell.

Hot carrier injection programming in present technologies takes place quickly in the range of 0.5 to 5 microseconds.

This is due to the high programming voltages which generate high cell channel currents Is 140 and Id 145, some of which is sent towards the floating gate 105. This fast programming makes it difficult to maintain precision for multilevel and analog applications. The high current poses power problems which may prevent the use of a single power supply voltage for the chip. It also restricts the number of cells which can be simultaneously programmed in a "page" of cells. Methods to reduce the programming current have been proposed at the expense of adding extra processing complexity to the cell.

The present invention solves or substantially mitigates these problems. A memory circuit according to the present invention controls the programming current directly and accomplishes a high degree of programming precision.

SUMMARY OF THE INVENTION

The present invention provides for an integrated circuit memory system and method for the precision programming of single or a plurality of nonvolatile memory cells. The invention enables each memory cell to either have a stored charge in one of a plurality of discrete levels corresponding to digital information or have a stored charge as part of a continuum corresponding to analog information.

Precision programming is achieved by directly controlling the current flowing between source and drain in the memory cell during hot carrier injection programming, thereby allowing reduced programming cell current and lower power operation. The reduced cell current enables a plurality of cells to be programmed simultaneously in a page of cells which improves programming time, requires only a single power supply, and does not require additional silicon processing steps.

Multiple program and verify cycles are performed with incrementally changing programming cell current during successive cycles to reduce programming time. The application of programming, verify or read cell voltages and current are performed in a predetermined manner including pre-charging the bitline depending on the characteristics of the particular memory cell type used.

In one embodiment, parts of the bitline driver do not require the use of high voltage circuitry which reduces circuit complexity. In addition, the use of voltage-mode sensing allows exactly the same circuit topology to be used for programming as for sensing operations further simplifying the circuit complexity. An alternative embodiment of the invention uses a pre-charge voltage control circuit to indirectly control the current in the memory cell while the current control circuit is turned off during programming.

BRIEF DESCRIPTION OF THE DRAWINGS

FIG. 1 is a generalized description of the principles of hot carrier injection programming in a nonvolatile memory cell as is known in the prior art.

FIGS. 2A–2D show four prior art examples of various cell process designs which program on the principle of hot carrier injection.

FIG. 3 is a generalized description of the principles of hot carrier injection programming in a nonvolatile memory cell used in accordance with the teachings of one embodiment of the present invention.

FIG. 4 is a block diagram of a preferred embodiment of this invention.

FIG. 5A shows details of one embodiment of this invention during a programming cycle.

FIG. 5B shows details of one embodiment of this invention during a verify or read cycle.

FIG. 6 shows details of one alternative embodiment of this invention during a programming cycle.

FIG. 7 is a block diagram of one embodiment of this invention utilizing a memory cell array in page mode operation.

DESCRIPTION OF THE PREFERRED EMBODIMENTS

It should be noted that the drawings have the elements with same reference numeral. This emphasizes the similar operation of the elements.

To avoid the problems described previously, a memory integrated circuit according to the present invention takes direct control of the channel 110 current during programming. By controlling that current directly, a high degree of programming precision is obtained. The circuits and methods described are applicable to a variety of cell process designs which program on the principle of hot carrier injection.

Precision Hot Carrier Injection Programming

FIG. 3 shows a nonvolatile memory cell 300 which programs by hot carrier injection. For the purposes of this discussion, we will assume the cell is n-channel and the cell is programmed by adding electrons to a floating gate 305. It should be obvious to those skilled in the art of nonvolatile memories that holes would be added to the floating gate 305 if the cell were of p-channel type. The cell shown in FIG. 3 is only a simplified representation showing only those features essential to the discussion and does not limit the applicability of this invention to other types of cell structures that also use hot carrier injection for programming. For instance, a control gate 325 shown in FIG. 3 may represent a plurality of control gates in some cell designs.

During programming the cell 300, the flow of electrons in a channel 310 from a source 315 to a drain 320 is represented by a source current, Is 340, and a drain current, Id 345. Somewhere in the channel 310, a high electric field region, Eh 335 produces hot electrons. Near the region 335, a vertical electric field, Ev 350 attracts some of the hot electrons through an oxide 330 to the floating gate 305. The electrons flowing to the floating gate 305 create a floating gate 305 charging current, Ig 355.

The floating gate charging current Ig 355 is small in comparison to either Is 340 or Id 345. Therefore Is 340 and Id 345 are approximately equal. The number of electrons entering the high electric field region, Eh 335, is directly related to Is 340 and Id 345. A portion of the electrons entering that region will become the hot electrons forming the floating gate charging current, Ig 355. Thus, Ig 355 is proportional to Is 340 and Id 345. For instance, reducing Is 340 or Id 345 during programming will reduce Ig 355. Ig 355 can be assumed constant only for small amounts of charge change on the floating gate 305 which would be the case when Ig 355 is small or for a short programming time. Assuming Ig 355 stays constant during programming, the change in the charge stored on the floating gate 305 is directly related to Ig 355 times the programming time.

Multilevel and analog memory applications require a high degree of precision in the amount of charge change on the floating gate 305. This can be obtained by approaching the desired charge level in small increments. A series of programming pulse and verify steps can accomplish this incremental programming approach if the amount of charge change with each pulse is small. For practical reasons, the shortest programming pulse time has a lower bound. Under ordinary conditions of hot carrier programming, that shortest pulse time usually changes the charge too much to be useful for the precision desired. Thus, to obtain a small charge change on the floating gate 305 during an individual programming pulse, Ig 355 must be reduced. This invention accomplishes that Ig 355 reduction by directly reducing the Is 340 or Id 345. The cell's programming rate is reduced to obtain a high degree of programming precision which is required for multilevel digital storage or analog information storage.

As electrons are added to the floating gate 305, the vertical electric field Ev 350 decreases, causing lower Ig 355 and slower programming. To mitigate this effect and shorten the total programming time using a series of programming pulses it is required to increase the Ig 355 with successive pulses in a prescribed manner. This invention accomplishes that by increasing Is 340 or Id 345 with successive programming pulses.

The precision programming by this invention is accomplished without adding extra cell processing steps. The reduced programming cell current allows many cells to be programmed simultaneously in a page of cells which offsets the slower programming rate. The resulting programming performance of the memory chip using this invention is improved while preserving the multilevel capability which reduces the chip's cost relative to single bit per cell memories.

General Description of Pulsed Current Programming Technique

The major blocks of a preferred embodiment of the present invention are shown in FIG. 4. These blocks are connected to a memory cell 45 to achieve erase, programming, verifying and reading. It is assumed that the memory cell 45 consists of a type of non-volatile memory cell which can be programmed using the hot carrier injection phenomenon. It is also assumed that during sensing for verify or read, the memory cell 45 is placed in the voltage-mode. The memory cell 45 can also be placed in a mode other than voltage-mode during verify and read.

A CL line 42 connects one terminal of the memory cell 45 to a common-line voltage control circuit block 41. In a memory array consisting of rows and columns of memory cells, the CL line 42 is normally shared amongst a plurality of memory cells in single or multiple rows or can be shared by all the memory cells in the memory array. In another type of memory array, known as the virtual ground array to those practicing the art, the CL line 42 is shared amongst a plurality of memory cells in a column of a memory array. The common-line voltage control circuit block 41 provides the appropriate voltage at the CL line 42 during the erase, program, verify and read of the memory cell 45 under the control of a erase, program, verify & read control circuit block 414. The erase, program verify & read control circuit block 414 consists of the necessary control and sequencing logic to accomplish the erasing, programming, verifying and reading of the memory cell.

A CG line 43 connects the memory cell 45 to the control-gate voltage control circuit block 44. The CG line 43 is normally shared amongst a plurality of memory cells in a row of a memory array. The control-gate voltage control circuit block 44 provides the appropriate voltage at the CG line 43 during erase, program, verify and read of the memory cell, under the control of the erase, program, verify & read control circuit block 414.

A BL line 415 connects the memory cell to a bitline selection circuit block 46. Normally, the BL line 415 is shared amongst a plurality of memory cells in a column of a memory array. In a virtual ground type memory array the CL line 42 and the BL line 415 run parallel and adjacent to each other. The bitline selection circuit block 46 either couples or decouples the BL line 415 from a VR line 48.

A pre-charge voltage control circuit block 404 connected to the VR line 48 pre-charges the VR line 48 during programming, verifying and reading of the memory cell 45. A pre-charge voltage generation block 410 has the capability to provide different amounts of pre-charge voltages to the pre-charge voltage control circuit block 404, under the control of the erase, program, verify & read control circuit block 414. The VPCHGEN line 406 connects the pre-charge voltage control circuit block 404 to the pre-charge voltage generation block 410.

A current control circuit block 403 connected to the VR line 48 causes a programming current pulse to pass through the memory cell 45 during programming and a constant current to pass through the memory cell 45 during verifying or reading. The current control circuit block 403 has a latch driven by a logic output line 402. The latch is reset if the logic output line 402 goes to a logic low during verify or read. At the beginning of a verify or read cycle, the latch is set by the erase, program, verify & read control circuit block 414. During programming, the latch is set and is independent of the logic output line 402. When the latch is set, the current control circuit block 403 passes either the programming current pulse during programming or constant current during verify or read.

An IGEN line 407 connects the current control circuit block 403 to a bitline current generation block 411. Under control of the erase, program, verify & read control circuit block 414, the bitline current generation block 411 controls the magnitude of the programming current pulse passing through the memory cell 45 during programming and also the magnitude of the constant current passing through the memory cell 45 during verifying and reading. The erase, program, verify & read control circuit block 414 also controls the duration of the programming current pulse passing through the memory cell 45 during programming.

A CERV line 408 connects the current control circuit block 403 to a current end reference voltage circuit block 412. The current end reference voltage circuit block 412 provides the appropriate voltage to allow the current control circuit block 403 to either sink or source current through the memory cell 45 either during the application of the programming current pulse while programming or during the application of the constant current while verifying or reading. If the current control circuit block 403 sinks current through the memory cell 45, the voltage on the CERV line 408 provided by the current end reference voltage circuit lock 412 is lower in magnitude with respect to the voltage provided by the common-line voltage control circuit block 41. In an example of sinking memory cell 45 current by the current control circuit block 403, the current end reference voltage circuit block 412 provides 0 V on the CERV line 408 and the common-line voltage control circuit block 41 provides higher voltage on the CL line 42. If the current control circuit block 403 sources current to the memory cell 45, the voltage provided by the current end reference voltage circuit block 412 on the CERV line 408 is higher in magnitude with respect to the voltage provided by the common-line voltage control circuit block 41 on the CL line 42. For example, the current end reference voltage circuit block 412 provides high voltage on the CERV line 408 and the common-line voltage control circuit block 41 provides 0 V when the current control circuit sources current to the memory cell 45.

During programming, the difference between voltages provided by the current end reference voltage circuit block 412 on the CERV line 408 and that provided by the common-line voltage control circuit block 41 on the CL line 42, either in the current sinking or the current sourcing case, is large enough to create the necessary conditions for hot electrons to be generated.

A voltage comparator block 49 connected to the VR line 48 and to the reference voltage selection block 405 through a VREF line 401, is used during verifying and reading of the memory cell 45 to determine whether the voltage on the VR line 48 is above or below the reference voltage on the VREF line 401. If during verify or read, the voltage on the VR line 48 is higher than the reference voltage on the VREF line 401, the voltage comparator block 49 outputs a logic high on the logic output line 402. If the voltage on the VR line 48 is lower than the reference voltage on the VREF line 401, the voltage comparator block 49 outputs a logic low on the logic output line 402. The reference voltages are provided to the reference voltage selection circuit block 405 by a reference voltage generation block 413 via a RVGEN bus 409.

The pre-charge voltage control circuit block 404, current control circuit block 403, voltage comparator 49, reference voltage selection circuit block 405, logic output line 402, and VREF line 401 together form a bitline driver block 416, as shown in FIG. 4.

In order to achieve a high programming precision, an ordered sequence of events have to happen under the control of the erase, program, verify & read control circuit block 414. First, the memory cell 45 is erased thorough an erase cycle, by applying the appropriate voltages at the CL line 42, the CG line 43 and the BL line 415. Erase here means the removal of electrons from the floating gate of the memory cell 45. After the erase cycle, an erase verification cycle is performed in order to verify whether the memory cell 45 has been erased properly. An erased cell will normally verify or read back a voltage on the VR line 48 which is outside the range of voltages expected to be read out of the memory cell 45 during program verifying or reading. During an erase verification cycle, the memory cell 45 is placed in the voltage-mode which is the same as that used during program verifying or reading. During the erase verification cycle, a voltage of the appropriate magnitude is placed on the VREF line 401 by the reference voltage selection circuit block 405. The voltage on the VR line 48 during erase verification is compared with the reference voltage on the VREF line 401. If the voltage on the VR line 48 is higher than the voltage on the VREF line 401, the logic output line 402 of the voltage comparator 49 switches to logic high, signifying that the memory cell 45 has been properly erased and no further erase cycles are to be performed. Otherwise, additional cycles of erasure followed by erase verification are performed until proper erasure of the memory cell 45 occurs. If the memory cell 45 does not erase within a maximum number of erase and erase verify cycles an, error flag is set in the erase, program, verify and read control circuit block 414. It may be preferred to use only one erase cycle followed by an erase verify cycle to erase a memory cell. Normally, a plurality of memory cells are erased, which can be in a single or multiple rows in a memory cell array.

Once the memory cell 45 is erased properly, the memory cell 45 is programmed. Programming here means addition of electrons to the floating gate of memory cell 45. A programming cycle begins by pre-charging the BL line 415 through the bitline selection circuit block 46 by the application of a pre-charge voltage Vpchg on the VR line 48. The pre-charge voltage Vpchg is generated by the pre-charge voltage generation block 410. Appropriate voltages, either high voltage or low voltage, are applied to either one or both of the CL line 42 and the CG line 43. The voltages applied to the CL line 42 and the CG line 43 during programming are generated by the common-line voltage control circuit block 41 and the control-gate voltage control circuit block 43 respectively. The timing relationship of the application of the respective voltages to the BL line 415, the CL line 42 and the CG line 43 is dependent on the characteristics of the memory cell 45 used and is controlled by the erase, program, verify & read control circuit block 414. After the pre-charge of the BL line 415 is completed, the pre-charge voltage Vpchg is removed from the VR line 48 and a programming current pulse of appropriate duration and magnitude is applied to the VR line 48 under the control of the erase, program, verify & read control circuit block 414.

An alternative embodiment of the invention uses the pre-charge voltage control circuit 404 to indirectly control the current in memory cell 45. The operation and circuit are the same except for the following exceptions. During the programming cycle, instead of providing a pre-charge signal, the pre-charge voltage control circuit 404 provides a voltage programming pulse to the VR line 48 which is transmitted to the BL line 415 via the bitline selection circuit 46. In this alternative embodiment, the current control circuit 403 is turned off during the programming cycle and is used only during the verify or read cycles.

After the completion of the programming pulse, the memory cell 45 goes through the program verification cycle. A preferred sensing mode is to place the memory cell 45 in the voltage-mode during program verification. The program verification cycle begins by pre-charging the BL line 415 through the bitline selection circuit block 46 by the application of a pre-charge voltage Vpchg on the VR line 48. The pre-charge voltage Vpchg is provided by the pre-charge voltage control circuit block 404. Appropriate voltages, either high voltage or low voltage, are applied to either one or both of the CL line 42 and the CG line 43. The voltages applied to the CL line 42 and the CG line 43 during verification are generated by the common-line voltage control circuit block 41 and the control-gate voltage control circuit block 43 respectively. The timing relationship of the application of the respective voltages to the BL line 415, the CL line 42 and the CG line 43 is dependent on the characteristics of the memory cell 45 used and is controlled by the erase, program, verify & read control circuit block 414. After the pre-charge of the BL line 415 is completed, the pre-charge voltage Vpchg is removed from the VR line 48 and a constant current of appropriate magnitude is applied to the VR line 48 by the current control circuit block 403, under the control of the erase, program, verify & read control circuit block 414. At the same time the appropriate voltage is provided by the current end reference voltage circuit block 412. After a transient period, a stable voltage is generated on the VR line 48 that is dependent; on the voltages at the CL line 42 and the CG line 43, on the constant current through the memory cell 45 caused by the current control circuit block 403, on the voltage provided by the current end reference voltage circuit block 412, and also on the amount of charge on the floating gate of the memory cell 45. A reference voltage of the appropriate magnitude is placed on the VREF line 401 at the input of the voltage comparator by the reference voltage selection circuit block 405. The stable voltage generated by the memory cell on the VR line 48, which is also an input to the voltage comparator 49, is compared to the reference voltage on the VREF line 401. If the logic output line 402 of the voltage comparator 49 is at logic high to signify that the voltage on the VR line 48 is higher than the voltage on the VREF line 401, then the erase, program, verify and read control circuit block performs another program cycle followed by a program verify cycle. The program and program verify cycles are continued until the voltage on the VR line 48 is lower than the voltage of the VREF line 401 during a program verify cycle as signified by the logic output line 402 of the voltage comparator 49 being driven logic low.

It is possible that during each successive program cycle the programming condition can be changed either: by changing the voltages on either or both of the lines CL 42 and CG 43, by changing the pre-charge voltage on the BL line 415, by changing either or both the magnitude or the duration of the programming current pulse, or any combination of the above conditions. After any condition of a program cycle, the appropriate reference voltage is applied on the VREF 401 line during the program verify cycle. The reference voltage on the VREF line 401 has a specific relationship to the condition of the previous program cycle and to the final expected voltage to be programmed into the memory cell 45 and read back in subsequent read cycles.

During a read cycle, a preferred sensing mode is to place the memory cell 45 in the voltage-mode. Under control of the erase, program, verify & read circuit block, the voltages on the CL 42 and the CG line 43, the pre-charge voltage Vpchg used to pre-charge the BL line 415, the constant current generated through the memory cell 45, and the voltage provided by the current end reference voltage circuit 412 setup during the read cycle are exactly in the same conditions as those setup during a program verification cycle. The voltage read from the memory cell 45 can be decoded to represent multiple digital bits. When multiple digital bits are decoded, then the reference voltage on the VREF line 401 used during the program verification cycle is a discrete representation of the multiple digital bits to be stored in the memory cell 45. The voltage read from the memory cell 45 can also be directly used in an analog system. In that case, the reference voltage on the VREF line 401 used during the program verification cycle is an analog representation of the analog voltage to be stored in the memory cell 45.

Details of One Embodiment of the Pulsed Current Programming Technique

For one embodiment, FIG. 5A shows the biasing conditions during programming of a memory cell 45 and FIG. 5B shows the biasing conditions during verifying and reading of the memory cell 45. FIG. 5A and FIG. 5B also show the same circuit embodiment of some of the blocks shown previously in FIG. 4. As an example for this embodiment, the memory cell 45 programs with hot electrons generated in the middle of the channel using an HESSCHEI cell design. The common-line voltage control circuit block 41 provides a high voltage VCL on the CL line 42 that is in the range of 6 V to 12 V during programming and a voltage in the range of 2 V to 6 V during verifying or reading. The specific voltage applied on the CL line 42 depends on the characteristics of the memory cell 45.

The control-gate voltage control circuit block 44 provides a low voltage VCG on the CG line 43 that is in the range of 1 V to 2 V during programming and a voltage in the range of 2 V to 6 V during verifying and reading. The specific voltage applied on the CG line 43 depends on the characteristics of the memory cell 45.

The bitline selection circuit block 46 consists of an n-channel MOS. transistor MN1 503 whose gate is connected to a voltage source VBLSEL 502 by a line 501. The VBLSEL voltage source 502 is controlled by the erase, program, verify & read circuit block 414 shown previously in FIG. 4. When 0 V is applied on the line 501, the MN1 transistor 503 decouples the BL line 415 from the VR line 48. When 5 V during programming or 8 V during verifying or reading is applied on the line 501, the MN1 transistor 503 couples the BL line 415 to the VR line 48.

The pre-charge voltage control circuit block 404 consists of an n-channel MOS transistor MN2 506, whose gate is connected to a voltage source VPCNTL by a line 505. The VPCNTL voltage on the line 505 is controlled by the erase, program, verify & read circuit block 414 shown previously in FIG. 4. One end of the MN2 transistor 506 is connected to the VR line 48 and the other end is connected to a voltage source Vpchg through a line 504. The Vpchg voltage is in the range of 0.5 V to 2 V during programming and in the range of 1 V to 6 V during verifying or reading. The specific voltage Vpchg used depends on the characteristics of the memory cell 45. When 0 V is applied on the line 505, the MN2 transistor 506 decouples the Vpchg voltage on line 504 from the VR line 48. When 5 V during programming and 8 V during verifying or reading, is applied on the line 505, the transistor MN2 couples the Vpchg voltage on line 504 to the VR line 48.

The current control circuit block 403 consists of a current mirror transistor pair consisting of n-channel MOS transistors MN3 512 and MN4 513. The MN3 transistor 512 is in the diode connected topology as understood by those skilled in the art. The diode-connected side of the MN3 transistor 512 is connected to one side of a transistor MN6 507 and a transistor MN5 511 by a line 516. The other end of the MN3 transistor 512 is connected the current end reference voltage circuit block 412 by the CERV line 408. The gate of MN4 transistor 513 is connected to the gate of the MN3 transistor 512. One terminal of the MN4 transistor 513 is connected to the VR line 48 and the other terminal is connected to the current end reference voltage circuit block 412 by the CERV line 408. The other end of the MN6 transistor 507 is connected to the IGEN line 407. The gate of the MN6 transistor 507 is connected to a line 514. The line 514 is also connected to the output of a LATCH 510 and to the input of an INV inverter 509. The output of the INV inverter 509 is connected to the gate of the MN5 transistor 511 by the line 515. The other end of the MN5 transistor 511 is connected to the current end reference voltage circuit block 412 through the CERV line 408. The input of the LATCH 510 is connected to the logic output line 402.

When the LATCH 510 is set, the line 514 is at a logic high level and when the LATCH is reset, the line 514 is at a logic low level. When the line 514 is at a logic high level, the MN6 transistor 507 couples the IGEN line 407 to the line 516 and the MN5 transistor 511 decouples the CERV line 408 from the 516 line. During a programming cycle, a programming current pulse IPULSE is applied to the IGEN line 407 by the bitline current generation block 411 shown previously in FIG. 4. IPULSE has a magnitude in the range of 0.5 $\mu$A to 50 $\mu$A and a duration in the range of 1 usec to 10 usec, as shown in FIG. 5A. During a verify or read cycle, a constant current ICONST is applied to the IGEN line 407 by the bitline current generation block 411, in shown previously in FIG. 4. ICONST has a magnitude in the range of 0.5 $\mu$A to 10 $\mu$A as shown in FIG. 5B. The specific magnitude and duration used for IPULSE and magnitude used for ICONST depends on the characteristics of the memory cell 45.

During programming, the diode-connected side of the MN3 transistor 512 is coupled to the IPULSE current pulse source on the IGEN line 407 and the other side of the MN3 transistor is coupled to 0 V (ground) by the current end reference voltage circuit block 412. During verifying or reading-the diode-connected side of the MN3 transistor 512 is coupled to the constant current source ICONST on the IGEN line 407.

During programming when the current pulse source IPULSE provides a current pulse of a certain magnitude and duration to the MN3 transistor 512, the MN4 transistor 513 sinks a similar current pulse to 0 V ground. During verifying or reading when the constant current source ICONST provides a constant current of a certain magnitude to the MN3 transistor 512, the MN4 transistor 513 sinks a similar constant current to 0 V ground. 0 V ground is developed on the CERV line 408 by the current end reference voltage circuit block 412. During programming and verifying or reading, the current pulse IPULSE and the constant current ICONST respectively, pass through the MN1 transistor 503, through the memory cell 45 and are sourced by the voltage source VCL provided by the common-line voltage control circuit block 41 on the CL line 42.

In order to achieve precision programming, the memory cell 45 is erased. During erase, 0 V is applied on the CL line 42 by the VCL voltage source in the common-line voltage control circuit block 41, 0 V is applied on the VR line 48 by the pre-charge voltage control circuit block 404, 5 V is applied to the line 501 to couple the BL line 415 to the VR line 48 and the LATCH 510 in the current control circuit block 403 is reset by the erase, program, verify and read control circuit block 414 shown previously in FIG. 4. Then, a high voltage pulse of magnitude 12 V and 10 msec duration is applied on the CG line 43 by the VCG voltage source in the control-gate voltage control circuit block 44. After the erase cycle, an erase verify cycle is performed. 4 V is applied on the CL line 42 and the CG line 43, 5 V is applied to line 501 to couple the BL line 415 to the VR line 48 and a pre-charge voltage Vpchg of 4 V is applied to the VR line 48 to pre-charge the BL line 415 to 4 V. A constant current ICONST of magnitude 10 $\mu$A is applied on the IGEN line 407 by the bitline current generation block 411, and 0 V (ground) is applied on the CERV line 408 by the current end reference voltage circuit block 412. A reference voltage representing the erase level is applied to the VREF line 401, which is selected by the reference voltage selection circuit block 405 from the voltage bus RVGEN 409. The reference voltages on the RVGEN voltage bus 409 are generated by the reference voltage generation block 413. The pre-charge voltage is next removed from the VR line 48 by applying 0 V on line 505 in the bit line control circuit block 404. Next, the LATCH 510 in the current control circuit block 403 is set by the erase, program, verify & read circuit block 414. At this time, the constant current ICONST passes through the memory cell 45 and is sunk to 0 V ground by the MN4 transistor 513. After a transient period, a stable voltage is developed on the VR line 48. The voltage comparator 49 is strobed to compare the voltage on the VR line 48 and the reference voltage on the VREF line 401. If the voltage on the VR line 48 is higher than the reference voltage on the VREF line 401, the output of the comparator logic output 402 is at a logic high level to signify that the memory cell 45 has been properly erased. Otherwise, the memory cell 45 goes through further erase and erase verify cycles.

The voltages VCL, VCG, Vpchg, the constant current ICONST and the timing relationship during the erase verify cycle are the same as those applied during the program verify or read cycles. The difference is the application of an appropriate reference voltage on the VREF line 401 during the erase verify, the program verify and the read cycle.

After the memory cell 45 is properly erased, programming begins. During programming, a high voltage 12 V is applied on the CL line 42 by the VCL voltage source in the common-line voltage control circuit block 41, 2 V is applied on the VR line 48 by the pre-charge voltage control circuit block 404, 5 V is applied to the line 501 to couple the BL line 415 to the VR line 48, 0 V (ground) is applied on the CERV line 408, and the LATCH 510 in the current control circuit block 403 is reset by the erase, program, verify & read control circuit block 414. Then, 2 V is applied on the CG line 43 by the VCG voltage source in the control-gate voltage control circuit block 44. Next, the LATCH 510 in the current control circuit block 403 is set by the erase, program verify & read circuit block 414. At the same time, a current pulse IPULSE starting at a low magnitude and a duration of 1 $\mu$sec is applied on the IGEN line 407 by the bitline current generation block 411. At this time, the pulse current IPULSE passes through the memory cell 45 and is sunk to 0 V ground by the MN4 transistor 513. At the end of the current pulse, the LATCH 510 in the current control circuit block 403 is reset by the erase, program, verify & read circuit block 414 and no more current is sunk through the memory cell 45.

After the programming cycle, a program verification cycle is performed, exactly the same as that of the erase verification cycle. A reference voltage representing the desired program level is applied to the VREF line 401, which is selected by the reference voltage selection circuit block 405 from the voltage bus RVGEN 409. If the logic output 402 of the comparator is low, the LATCH 514 is reset and no further programming current pulses are applied to the memory cell 45. Otherwise, further program/verify cycles are performed on the memory cell 45, until the logic output 402 of the comparator is low during a program verify cycle or an error flag is set in the erase, program, verify & read block 414 once a maximum number of program/verify cycles is reached. During each successive program cycle, the current pulse IPULSE is incremented by a certain amount dependent on the characteristics of the memory cell 45.

The current control circuit block 403, the current end reference voltage circuit block 412, the logic output line 402, the CERV line 408, and the IGEN line 407 all of which are part of the bitline driver 416 do not require the use of high voltage circuitry which reduces circuit complexity. In addition, the use of voltage-mode sensing allows exactly the same circuit topology to be used for programming as for sensing operations further simplifying the circuit complexity.

Details of Another Embodiment During Programming Using Pulsed Current Programming Technique FIG. 6 shows details of another embodiment during programming. In this embodiment current in sourced by the current control circuit block 403. The current control circuit block 403 consists of a cascode current mirror consisting of p-channel transistors MP1 601, MP2 603, MP3 602 and MP4 604. The voltage provided by the current end reference voltage circuit block 412 on the CERV line 408 is higher in magnitude than the voltage provided by the common-line voltage control circuit block 41 on the CL line 42. The voltage on the CERV line 408 is in the range of 8 V to 14 V and the voltage on the CL line 42 is 0 V. The bitline selection circuit block 46, the control-gate voltage control circuit block 44 and the pre-charge voltage control circuit block 404 perform the same function as taught in the previous embodiment.

Page-Mode Operation

FIG. 7 shows the block diagram of a memory array 715 consisting of M columns and N rows of memory cells 45. A plurality of memory cells 45 from a selected row can be programmed in a paged-mode fashion to reduce the effective programming time.

Under the control of the X Address Inputs on a line 703, one of a plurality of X-Decode blocks 701–702 select the appropriate pair of common-line voltage control circuit block 41 and control-gate voltage control circuit block 44. Each selected X-Decode block 701–702 thus selects the application of the appropriate voltages on a pair of lines CL and CG. For example, X-Decode 702 will select a pair of common-line voltage control circuit block 41 and control-gate voltage control circuit block 44 to allow the application of voltages on a CLN line 708 and a CGN line 709. This way all the memory cells 45 in row number N have voltages applied.

Under the control of Y Address Inputs on a line 704, a Y-Decode block 705 selects a page consisting of a plurality of columns, or bit lines, through the bitline selection circuit blocks 46. For clarity reasons, in FIG. 6 it is shown that each bitline selection circuit block 46 is connected to only one bit line. It should be understood that the bitline selection circuits blocks 46 can be implemented to connect to a plurality of bit lines.

During an erase cycle, all the memory cells on a selected row are erased. During programming, a page of memory cells 45 are programmed and verified in a parallel fashion. A page can be all, or a subset of, the memory cells 45 on a selected row. During a read cycle, a page of memory cells are read in parallel.

While various preferred and alternate embodiments of the present invention have been disclosed and described in detail, it should be evident that the present invention is equally applicable by making appropriate modifications to the embodiment described above. In other instances, well known electrical structures and circuits are shown in block diagram form in order not to unnecessarily obscure the present invention. Therefore, the above description should not be taken as limiting the scope of invention which is defined by the metes and bounds of the appended claims.

What is claimed is:

1. An integrated circuit memory system comprising:

control means for controlling operations of said integrated circuit memory system;

a plurality of memory cells, each memory cell comprising a source, drain, control gate and floating gate, said floating gate capable of storing electric charge, said memory cells programmable by hot carrier injection of electric charge to said floating gate corresponding to input signals to said integrated memory system; and circuit means, responsive to said control means, for iteratively applying incrementally varying voltages to a source, drain, or control gate of a selected memory cell and for controlling a current independently of said input signals, said current flowing between said source and drain during programming of said selected memory cell so that an amount of electric charge stored on said floating gate of said selected memory cell is precisely controlled.

2. In an integrated memory system having a plurality of memory cells, each memory cell comprising a source, drain, control gate and floating gate, said floating gate capable of storing electric charge, said memory cells programmable by hot carrier injection corresponding to input signals to said integrated memory system, a method for programming said memory cells comprising:

iteratively applying incrementally varying voltages to a source, drain, or control gate of a selected memory cell and controlling a current independently of said input signals, said current flowing between said source and drain of said selected memory cell so that an amount of electric charge stored on said floating gate of said selected memory cell is precisely controlled.

3. The system of claim 1 wherein said circuit means applies incrementally increasing voltages to said control gate of said selected memory cell during iterative programming of said selected memory cell.

4. The system of claim 1 wherein said circuit means applies incrementally decreasing voltages to said control gate of said selected memory cell during iterative programming of said selected memory cell.

5. The system of claim 1 wherein said circuit means applies incrementally increasing voltages to said drain of said selected memory cell during iterative programming of said selected memory cell.

6. The system of claim 1 wherein said circuit means applies incrementally increasing voltages to said source of said selected memory cell during iterative programming of said selected memory cell.

7. The system of claim 1 wherein said circuit means increases current magnitude incrementally during iterative programming of said selected memory cell.

8. The system of claim 1 wherein said circuit means increases current duration incrementally during iterative programming of said selected memory cell.

9. The system of claim 1 wherein said circuit means operates on a selected plurality of memory cells so that said selected plurality of memory cells are programmed as a group.

10. The system of claim 9 wherein said plurality of memory cells are arranged in an array of rows and columns and wherein said circuit means operates on said selected plurality of memory cells in a selected row as a group.

11. The system of claim 10 wherein said circuit means comprises a plurality of control blocks, one of said plurality of control blocks connected to one of said selected plurality of memory cells during programming.

12. The system of claim 10 wherein each memory cell in a row has a source and control gate respectively connected in common to said circuit means, and each memory cell in a column has a drain connected in common to said circuit means.

13. The system of claim 10 wherein each memory cell in a row has a control gate connected in common to said circuit means, and each memory cell in a column has a source and a drain respectively connected in common to said circuit means.

14. The system of claim 1 wherein said circuit means controls said current between said source and drain of said selected memory cell independently of any electrical characteristics of said selected memory cell.

15. The system of claim 1 wherein said circuit means controls said current between said source and drain of said selected memory cell independently of any charge stored in said selected memory cell.

16. An integrated circuit memory system comprising:

control means for controlling operations of said integrated circuit memory system;

a plurality of memory cells, each memory cell comprising a source, drain, control gate and floating gate, said floating gate capable of storing electric charge, said memory cells programmable by hot carrier injection of electric charge to said floating gate corresponding to input signals to said integrated circuit memory system; and circuit means, responsive to said control means, for iteratively applying preselected voltages to a source, drain, and control gate of a selected memory cell and for controlling a current independently of said input signals, said current flowing between said source and drain during programming of said selected memory cell, said current varying incrementally during said iterative programming so that an amount of electric charge stored on a floating gate of said selected memory cell is precisely controlled.

17. The system of claim 16 wherein said circuit means increases current magnitude incrementally during iterative programming of said selected memory cell.

18. The system of claim 16 wherein said circuit means increases current duration incrementally during iterative programming of said selected memory cell.

19. The system of claim 16 wherein said circuit means operates on a selected plurality of memory cells so that said selected plurality of memory cells are programmed as a group.

20. The system of claim 19 wherein said plurality of memory cells are arranged in an array of rows and columns and wherein said circuit means operates on said selected plurality of memory cells in a selected row as a group.

21. The system of claim 20 wherein said circuit means comprises a plurality of control blocks, one of said plurality of control blocks connected to one of said selected plurality of memory cells during programming.

22. The system of claim 20 wherein each memory cell in a row has a source and control gate respectively connected in common to said circuit means, and each memory cell in a column has a drain connected in common to said circuit means.

23. The system of claim 20 wherein each memory cell in a row has a control gate connected in common to said circuit means, and each memory cell in a column has a source and a drain respectively connected in common to said circuit means.

24. The system of claim 16 wherein said circuit means controls said current between said source and drain of said selected memory cell independently of any electrical characteristics of said selected memory cell.

25. The system of claim 16 wherein said circuit means controls said current between said source and drain of said selected memory cell independently of any charge stored in said selected memory cell.

26. An integrated circuit memory system comprising:
a system control block;
an array of memory cells, each memory cell having a first terminal, a second terminal, a control gate and a floating gate, said floating gate capable of storing electric charge, said memory cells programmable by hot carrier injection of electric charge to said floating gate corresponding to input signals to said integrated circuit memory system;
a first control block connected to a first terminal of a memory cell selected for programming, said first control block generating preselected programming voltages independently of said input signals;
a second control block connected to a second terminal of said selected memory cell, said second control block generating preselected controlled currents independently of said input signals; and
a third control block connected to a control gate of said selected memory cell, said third control block generating incrementally varying programming voltages independently of said input signals;
whereby said first, second and third control blocks, responsive to said system control block, cooperatively control currents flowing between said first terminal and said second terminal during iterative programming of said selected memory cell so that an amount of electric charge stored on a floating gate of said selected memory cell is precisely controlled.

27. The system of claim 26 wherein said third control block generates incrementally increasing programming voltages independently of said input signals.

28. The system of claim 26 wherein said third control block generates incrementally decreasing programming voltages independently of said input signals.

29. The system of claim 26 wherein said first, second and third control blocks operate on a selected plurality of memory cells so that said selected plurality of memory cells is programmed as a group.

30. The system of claim 26 wherein said second control block comprises:
a current control circuit connected to said second terminal of said selected memory cell and driving said controlled currents through said selected memory cell during programming.

31. The system of claim 30 wherein said current control circuit iteratively drives said controlled currents through said selected memory cell during programming of said selected memory cell, said controlled currents increasing in magnitude in subsequent iterations.

32. The system of claim 31 wherein said controlled currents have a magnitude range of 0.5 $\mu$A to 50 $\mu$A.

33. The system of claim 30 wherein said current control circuit iteratively drives said controlled currents through said selected memory cell during programming of said selected memory cell, said controlled currents increasing in duration in subsequent iterations.

34. The system of claim 33 wherein said controlled currents have a duration of 1 $\mu$s to 10 $\mu$s.

35. An integrated circuit memory system comprising:
a system control block;
an array of memory cells, each memory cell having a first terminal, a second terminal, a control gate and a floating gate, said floating gate capable of storing electric charge, said memory cells programmable by hot carrier injection of electric charge to said floating gate corresponding to input signals to said integrated circuit memory system;
a first control block connected to a first terminal of a memory cell selected for programming, said first control block generating incrementally increasing programming voltages independently of said input signals;
a second control block connected to a second terminal of said selected memory cell, said second control block generating preselected controlled currents independently of said input signals; and
a third control block connected to a control gate of said selected memory cell, said third control block generating preselected programming voltages independently of said input signals;
whereby said first, second and third control blocks, responsive to said system control block, cooperatively control currents flowing between said first terminal and said second terminal during iterative programming of said selected memory cell so that an amount of electric charge stored on a floating gate of said selected memory cell is precisely controlled.

36. The system of claim 35 wherein said first, second and third control blocks operate on a selected plurality of memory cells so that said selected plurality of memory cells is programmed as a group.

37. The system of claim 35 wherein said second control block comprises:
a current control circuit connected to said second terminal of said selected memory cell and driving said controlled currents through said selected memory cell during programming.

38. The system of claim 37 wherein said current control circuit iteratively drives said controlled currents through said selected memory cell during programming of said selected memory cell, said controlled currents increasing in magnitude in subsequent iterations.

39. The system of claim 38 wherein said controlled currents have a magnitude range of 0.5 $\mu$A to 50 $\mu$A.

40. The system of claim 37 wherein said current control circuit iteratively drives said controlled currents through said selected memory cell during programming of said selected memory cell, said controlled currents increasing in duration in subsequent iterations.

41. The system of claim 40 wherein said controlled currents have a duration of 1 $\mu$s to 10 $\mu$s.

42. The method of claim 2 wherein said iterative applying and controlling step comprises applying incrementally increasing voltages to said control gate of said selected memory cell.

43. The method of claim 2 wherein said iterative applying and controlling step comprises applying incrementally increasing voltages to said drain of said selected memory cell.

44. The method of claim 2 wherein said iterative applying and controlling step comprises applying incrementally increasing voltages to said source of said selected memory cell.

45. The method of claim 2 wherein said iterative applying and controlling step comprises incrementally increasing current magnitude.

46. The method of claim 2 wherein said iterative applying and controlling step comprises incrementally increasing current duration.

47. The method of claim 2 further comprising:
selecting a plurality of said memory cells; and
applying incrementally varying voltages to a source, drain, or control gate and controlling the current flowing between said source and drain of each of said selected plurality of memory cells as a group independently of said input signals so that an amount of electric charge stored on said floating gate of each of said selected plurality of memory cells is precisely controlled to program said selected plurality of memory cells as a group.

48. The method of claim 47 further comprising:
arranging said plurality of memory cells in an array of rows and columns; and
wherein said selecting step comprises:
selecting one of said rows and selecting a plurality of memory cells within said selected row.

49. The method of claim 2 wherein said applying voltage and current controlling step comprises controlling said current between said source and drain of said selected memory cell independently of any electrical characteristics of said selected memory cell.

50. The method of claim 2 wherein said applying voltage and current controlling step comprises controlling said current between said source and drain of said selected memory cell independently of any charge stored in said selected memory cell.

51. In an integrated memory system having a plurality of memory cells, each memory cell comprising a source, drain, control gate and floating gate, said floating gate capable of storing electric charge, said memory cells programmable by hot carrier injection corresponding to input signals to said integrated memory system, a method for programming said memory comprising:
iteratively applying preselected voltages to a source, drain, and control gate of a selected memory cell and controlling a current independently of said input signals, said current flowing between a source and drain of said selected memory cell, said current varying incrementally so that an amount of electric charge stored on a floating gate of said selected memory cell is precisely controlled.

52. The method of claim 51 wherein said iterative applying and controlling step comprises increasing current magnitude incrementally.

53. The method of claim 51 wherein said iterative applying and controlling step comprises increasing current duration incrementally.

54. The method of claim 51 further comprising:
selecting a plurality of said memory cells; and
iteratively applying preselected voltages to a source, drain, and control gate and controlling the current flowing between said source and drain, said current varying incrementally, of each of said selected plurality of memory cells as a group independently of said input signals so that an amount of electric charge stored on said floating gate of each of said selected plurality of memory cells is precisely controlled to program said selected plurality of memory cells as a group.

55. The method of claim 54 further comprising:
arranging said plurality of memory cells in an array of rows and columns; and
wherein said selecting step comprises:
selecting one of said rows and selecting a plurality of memory cells within said selected row.

56. The method of claim 51 wherein said applying voltage and current controlling step comprises controlling said current between said source and drain of said selected memory cell independently of any electrical characteristics of said selected memory cell.

57. The method of claim 51 wherein said applying voltage and current controlling step comprises controlling said current between said source and drain of said selected memory cell independently of any charge stored in said selected memory cell.

58. In an integrated circuit memory system having an array of memory cells, each memory cell comprising a first terminal, a second terminal, a control gate and a floating gate, said floating gate capable of storing electric charge, said memory cells programmable by hot carrier injection corresponding to input signals to said integrated circuit memory system, a method for programming a selected memory cell comprising:
applying erase voltages to said first terminal, said second terminal, and said control gate of said selected memory cell so that said electric charge corresponding to input signals is removed from said floating gate to erase said selected memory cell;
applying preselected programming voltages to said first terminal, said second terminal, and control gate and controlling the current flowing between said first terminal and said second terminal of said selected memory cell independently of said input signals so that an amount of electric charge stored on said floating gate is precisely controlled to program said selected memory cell; and applying programming verify voltages to said first terminal and said control gate, comparing said voltage at said second terminal of said selected memory cell with respect to a program reference voltage to verify that said selected memory cell is programmed; and repeating said programming voltages and programming verify voltages applying steps until a programming verify voltages applying step verifies that said selected memory cell is programmed, said preselected programming voltages incrementally increasing on said first terminal, said second terminal, or said control gate of said selected memory cell at each repetition.

59. The method of claim 58 wherein said programming voltage applying and current controlling step comprises incrementally increasing said programming voltages applied to said control gate of said selected memory cell in subsequent repetitions.

60. The method of claim 59 further comprising applying said erase voltages, said programming voltages and said programming verify voltages to a selected plurality of memory cells as a group to program said selected plurality of memory cells.

61. The method of claim 59 wherein said programming voltage applying and current controlling step comprises incrementally increasing magnitude of said current flowing between said first terminal and said second terminal in subsequent repetitions.

62. The method of claim 61 wherein said magnitude of said current is in a range of 0.5 $\mu$A to 50 $\mu$A.

63. The method of claim 59 wherein said programming voltage applying and current controlling step comprises incrementally increasing duration of said current flowing between said first terminal and said second terminal in subsequent repetitions.

64. The method of claim 63 wherein said duration of said current is in a range of 1 $\mu$s to 10 $\mu$s.

65. The method of claim 58 wherein said programming voltage applying and current controlling step comprises incrementally increasing said programming voltages applied to said first terminal of said selected memory cell in subsequent repetitions.

66. The method of claim 58 further comprising applying said erase voltages, said programming voltages and said programming verify voltages to a selected plurality of memory cells as a group to program said selected plurality of memory cells.

67. The method of claim 65 wherein said programming voltage applying and current controlling step comprises incrementally increasing magnitude of said current flowing between said first terminal and said second terminal in subsequent repetitions.

68. The method of claim 67 wherein said magnitude of said current is in a range of 0.5 $\mu$A to 50 $\mu$A.

69. The method of claim 65 wherein said programming voltages applying and current controlling step comprises incrementally increasing duration of said current flowing between said first terminal and said second terminal in subsequent repetitions.

70. The method of claim 69 wherein said duration of said current is in a range of 1 $\mu$s to 10 $\mu$s.

* * * * *